United States Patent
Kang et al.

(10) Patent No.: US 7,737,781 B2
(45) Date of Patent: Jun. 15, 2010

(54) DIFFERENTIAL AMPLIFIER AND INPUT CIRCUIT USING THE SAME

(75) Inventors: Shin Deok Kang, Ichon (KR); Dong Uk Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 53 days.

(21) Appl. No.: 12/018,776

(22) Filed: Jan. 23, 2008

(65) Prior Publication Data

US 2009/0045874 A1   Feb. 19, 2009

(30) Foreign Application Priority Data

Aug. 13, 2007   (KR) .................... 10-2007-0081026

(51) Int. Cl.
 *H03F 3/45* (2006.01)
(52) U.S. Cl. .................... 330/253; 330/124 R; 330/295
(58) Field of Classification Search ................ 330/253, 330/124 R, 295
See application file for complete search history.

(56) References Cited

U.S. PATENT DOCUMENTS

| | | | |
|---|---|---|---|
| 4,377,789 A * | 3/1983 | Hoover | 330/253 |
| 5,311,145 A * | 5/1994 | Huijsing et al. | 330/255 |
| 6,392,475 B1 | 5/2002 | Lee | |
| 6,525,608 B2 * | 2/2003 | Krupnik | 330/253 |
| 6,657,495 B2 * | 12/2003 | Ivanov et al. | 330/255 |
| 6,781,460 B2 * | 8/2004 | Crain et al. | 330/253 |
| 6,870,424 B2 | 3/2005 | Pradhan et al. | |
| 6,924,702 B2 * | 8/2005 | Chen | 330/253 |
| 7,123,531 B2 | 10/2006 | Rho | |
| 7,154,806 B2 | 12/2006 | Kang | |

FOREIGN PATENT DOCUMENTS

| | | |
|---|---|---|
| JP | 01-204514 | 8/1989 |
| JP | 04-230118 | 8/1992 |
| JP | 07-245558 | 9/1995 |
| JP | 2000-040368 | 2/2000 |
| JP | 2002-111410 | 4/2002 |
| JP | 2002-185272 | 6/2002 |
| KR | 1020020035324 A | 5/2002 |
| KR | 1020060018533 A | 3/2006 |
| KR | 10-2006-0047403 | 5/2006 |

* cited by examiner

*Primary Examiner*—Patricia Nguyen
(74) *Attorney, Agent, or Firm*—Baker & McKenzie LLP

(57) ABSTRACT

A differential amplifier comprises a plurality of first switching elements configured to output differentially amplified signals through output terminals when a voltage level of a first input signal and a second input signal belongs to a first range and a plurality of second switching elements configured to output the differentially amplified signals through the output terminals when the voltage level of the first input signal and the second input signal belongs to a second range.

24 Claims, 4 Drawing Sheets

DIFFERENTIAL AMPLIFIER AND INPUT CIRCUIT USING THE SAME

CROSS-REFERENCES TO RELATED APPLICATION

The present application claims priority under 35 U.S.C. §119(a) to Korean application number 10-2007-0081026, filed on Aug. 13, 2007, in the Korean Patent Office, which is incorporated by reference in its entirety as if set forth in full.

BACKGROUND

1. Technical Field

The embodiments described herein relate to semiconductor circuit technology and, more particularly, to a differential amplifier and an input circuit using the same.

2. Related Art

A conventional semiconductor memory device includes a signal transferring unit for receiving and transferring a signal and a signal processing unit for processing the signal transferred from the signal transferring unit according to a prescribed operation.

A conventional signal processing unit is also called a core circuit. A conventional core circuit integrates different kinds of elements. In fact a conventional core circuit will includes as many elements as is possible within the limits of the associated design technology and the processing capacity of the semiconductor memory device.

For example, a conventional core unit includes an input circuit for transferring an input signal to the core unit, and an output circuit for outputting data from the core unit.

The input circuit receives various signals transferred from the outside, namely, an address signal, a clock signal, and data signal and transfers them to the core circuit positioned inside the semiconductor memory device. The output circuit outputs the data, which correspond to the received address. Therefore, the input circuit, which receives the data and address signals, should perform an accurate buffering operation to ensure reliable operation.

A conventional input circuit includes a differential amplifier having a MOS transistor (hereinafter, a transistor). The operational characteristic of the transistor can be changed by a PVT (process, voltage, temperature) fluctuation. Also, when the input circuit is included in a mobile device, a termination operation is not performed in order to minimize operating current and conserve power; however, forgoing the termination operation can result in a voltage change. This is because the termination operation controls the voltage levels of input signals 'IN' and 'VREF' to be within a prescribed range, to cope with the fluctuation of external high and low voltages (VDD) and (VSS), '.

As shown in FIG. 1, when the termination operation is performed, the input signals 'IN' and 'VREF' have a voltage swing that is bounded by the external high voltage (VDD). The input signal 'IN' can be a clock signal and the input signal 'VREF' can be out of phase with the clock signal.

Meanwhile, as shown in FIG. 1, when the terminal operation is not performed, the input signals 'IN' and 'VREF' swing in an abnormal voltage range that can be bounded by an external low voltage (VSS). In such situations, the middle voltage (Vmp) of the input signals 'IN' and 'VREF' is less than ½(VDD) because of the termination operation is not performed. AS a result, the gate-source voltage (Vgs) of a transistor that receives the input signals 'IN' and 'VREF' can be low as compared with the threshold voltage (Vth) of the transistor. When the gate-source voltage (Vgs) is lower than the threshold voltage (Vth), the transistor cannot operate, and thus the input circuit operates abnormally or cannot operate at all.

Although the duty ratio of the input signals 'IN' and 'VREF' is constant, if the input circuit operates abnormally or cannot operate at all, then the duty ratio of an output signal of the input circuit can be distorted. As shown in FIG. 2, when the middle voltage (Vmp) is less than 50 percent of the external voltage (VDD), the duty ratio of the output signal of the input circuit is rapidly distorted to be less than 50 percent. If the duty ratio is distorted, the margin of a setup/hold time is reduced. Eventually, the semiconductor memory device will produce an output error.

SUMMARY

A differential amplifier capable of performing a stable output operation regardless of a voltage fluctuation of received signals and an input circuit having the same are described herein.

According to one aspect, a differential amplifier comprises a plurality of first switching elements configured to output first differentially amplified signals through output terminals when a voltage levels of a first input signal and a second input signal are within a first range, and a plurality of second switching elements configured to output second differentially amplified signals through the output terminals when the voltage levels of the first input signal and the second input signal are within a second range.

According to another aspect, an input circuit comprises a first input unit for differentially amplifying a voltage level difference between a first input signal and a second input signal to output first or second differentially amplified signals by using a plurality of switching elements configured to selectively operate when a voltage level of the first input signal and the second input signal are within a first range or when the voltage level of the first input signal and the second input signal are within a second range, and a second input unit for differentially amplifying the first or second differentially amplified signals to output third differentially amplified signals.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
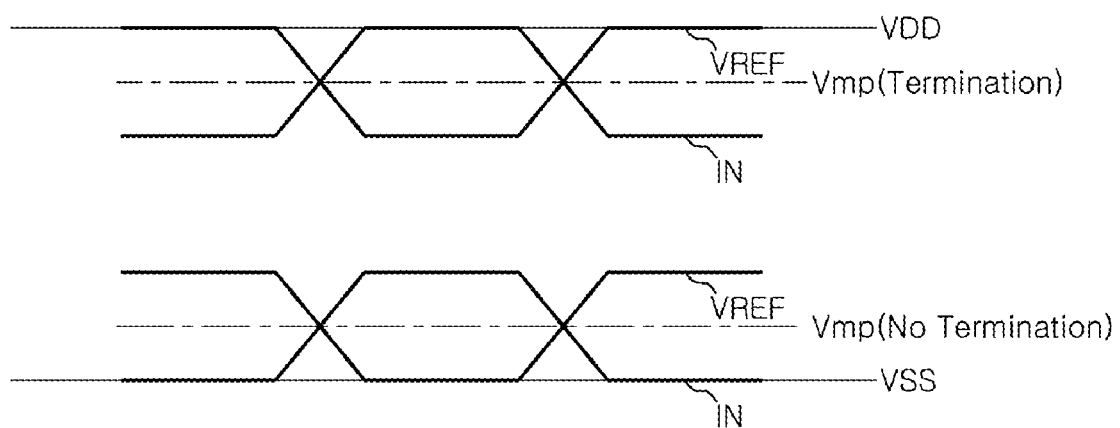
FIG. 1 is a waveform diagram illustrating a change of input signals according to a voltage fluctuation.
Figure 2:
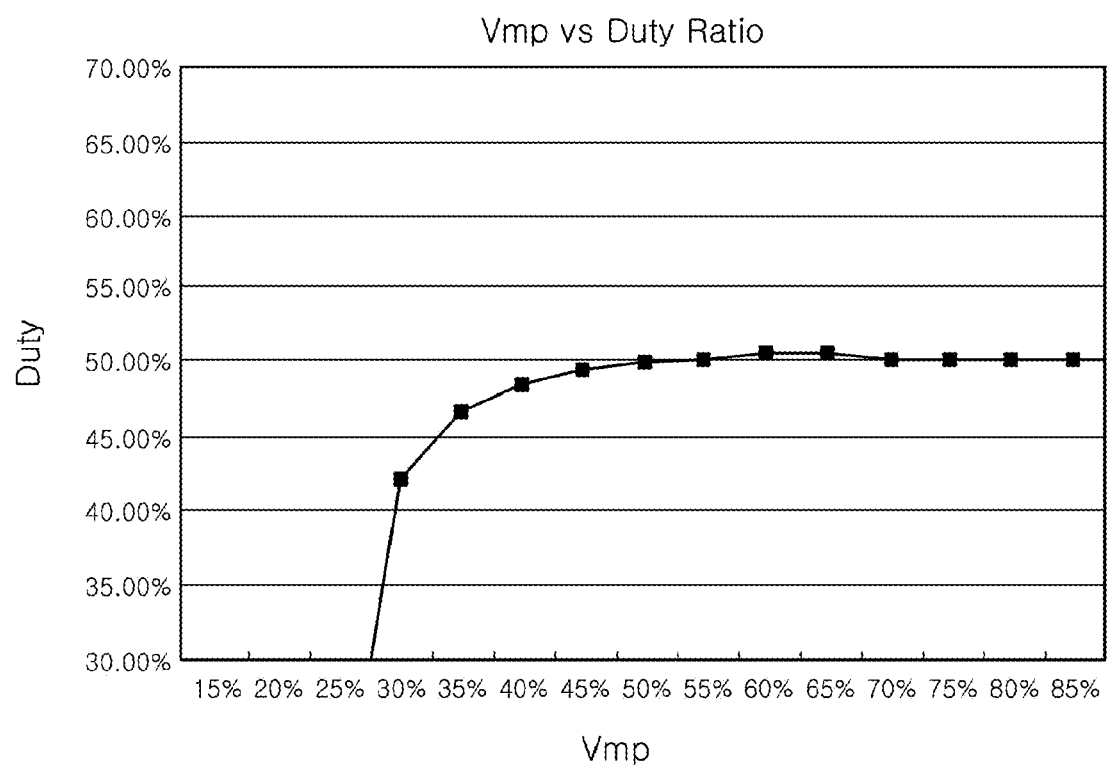
FIG. 2 is a voltage-to-duty ratio graph of a conventional input circuit.
Figure 3:
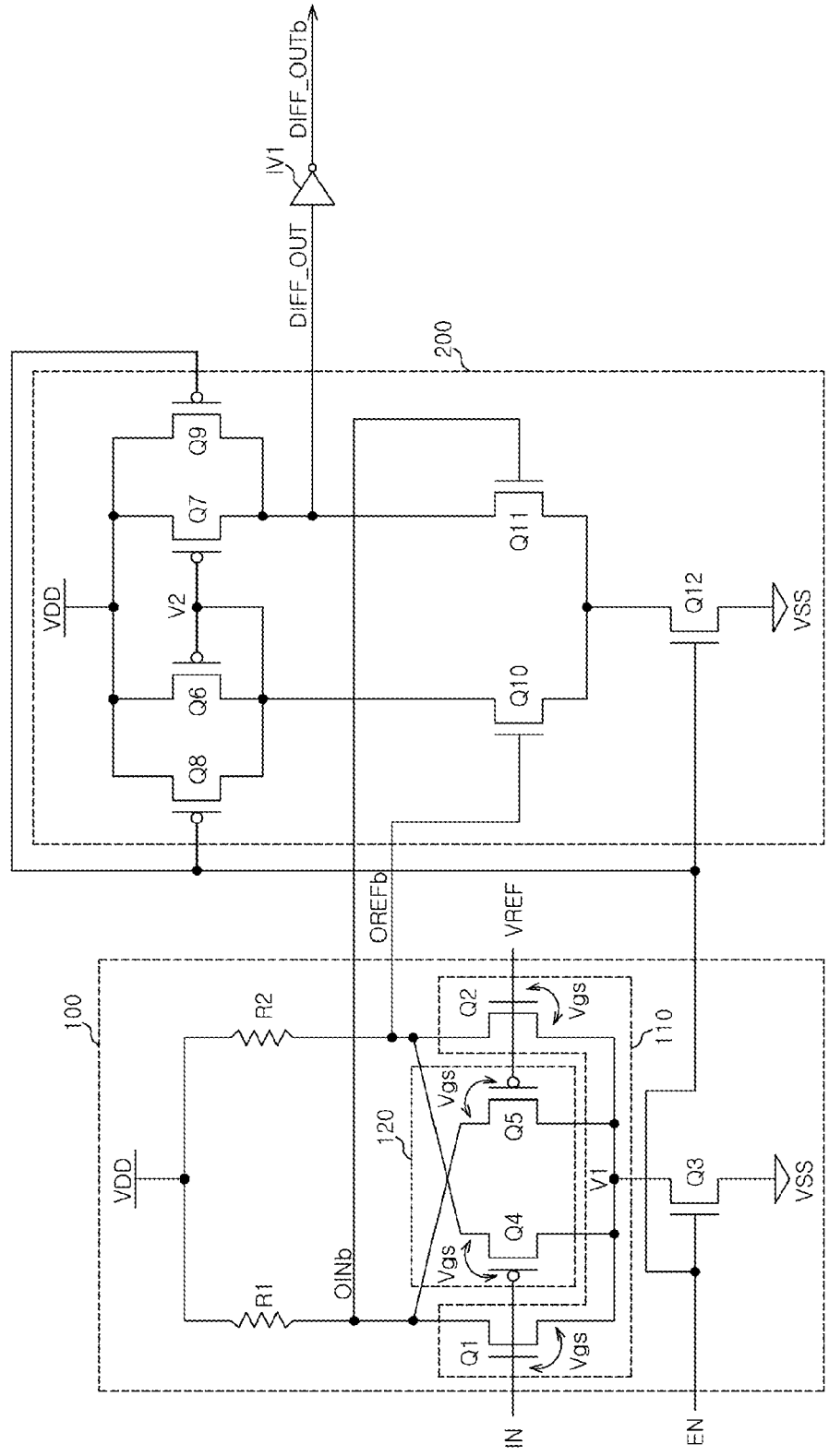
FIG. 3 is a circuit diagram illustrating an example input circuit according to one embodiment.
Figure 4:
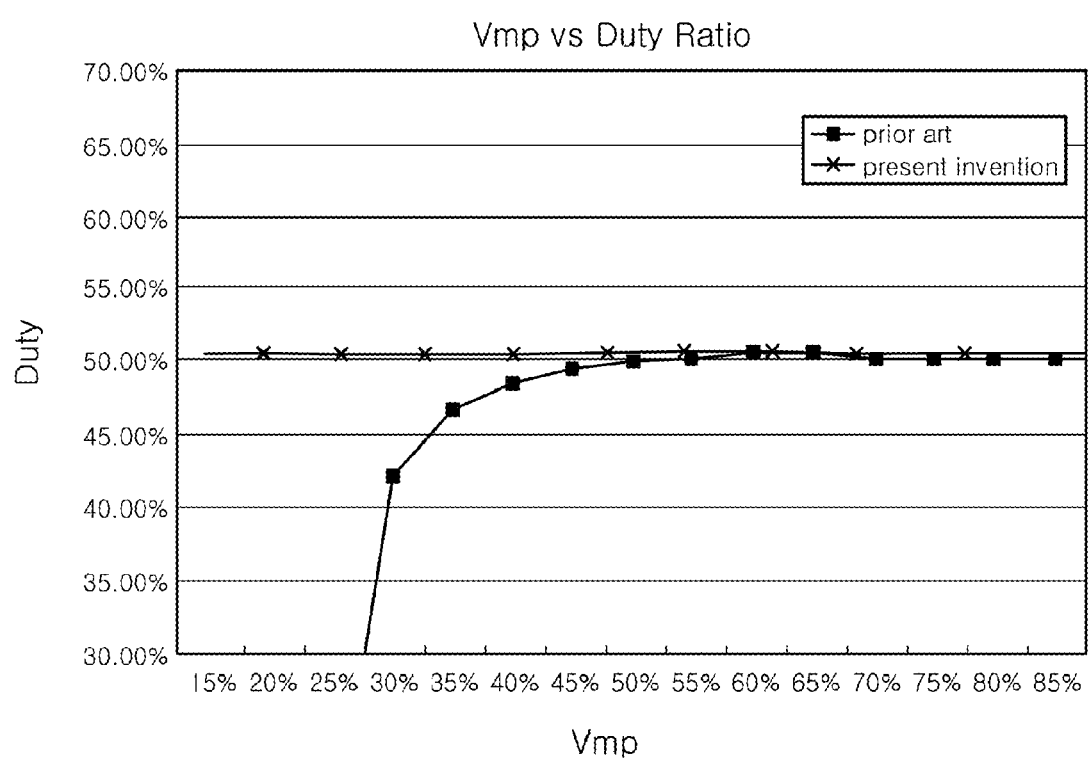
FIG. 4 is a voltage-to-duty ratio graph for the input circuit of FIG. 3.

FIG. 3 is a diagram illustrating an example input circuit 101 configured in accordance with one example embodiment. As shown in FIG. 3, the input circuit 101 can include a first input unit 100 and a second input unit 200.

The first input unit 100 can include a differential amplifier. The differential amplifier can include a first resistor R1 and a second resistor R2, where each resistor can have one end connected to an external power source (VDD), a first amplifier circuit 110, a second amplifier circuit 120 and a third transistor Q3.

The first amplifier circuit 110 can be configured to amplify a level difference between a first input signal 'IN' and a second input signal 'VREF' to output a first output signal 'OINb' and a second output signal 'OREFb' when the level of a middle voltage (Vmp) of the first input signal 'IN' and the second input signal 'VREF' is higher than that of a threshold voltage (Vth) of transistors that receive the first input signal 'IN' and the second input signal 'VREF', namely transistors Q1 and Q2 as described below The first amplifier circuit 110 can include a first resistor R1, a second resistor R2, and first and second transistors Q1 and Q2. A drain of the first transistor Q1 can be connected to the other end of the first resistor R1 and a gate of the first transistor Q1 can receive the first input signal 'IN'. A drain of the second transistor Q2 can be connected to the other end of the second resistor R2 and a gate of the second transistor Q2 can receive the second input signal 'VREF'. The first output signal 'OINb' can be output through a common node between the first resistor R1 and the first transistor Q1. The second output signal 'OREFb' can be output through a common node between the second resistor R2 and the second transistor Q2.

A drain of the third transistor Q3 can be commonly connected to sources of the first transistor Q1 and the second transistor Q2. A gate of the third transistor Q3 can receive an enable signal 'EN' and a source of the third transistor Q3 can be connected to a ground terminal (VSS). Each of the first to third transistors Q1 to Q3 can be a NMOS transistor.

The second amplifier circuit 120 can be configured to amplify a level difference between the first input signal 'IN' and the second input signal 'VREF' to output the first output signal 'OINb' and the second output signal 'OREFb' in case that the level of the middle voltage (Vmp) of the first input signal 'IN' and the second input signal 'VREF' is lower than that of the threshold voltage (Vth) of the fourth and fifth transistors Q4 and Q5.

The second amplifier circuit 120 can include fourth and fifth transistors Q4 and Q5. A source of the fourth transistor Q4 can be connected to the common node between the second resistor R2 and the second transistor Q2. A gate of the fourth transistor Q4 can receive the first input signal 'IN', and a drain of the fourth transistor Q4 can be connected to the drain of the third transistor Q3. A source of the fifth transistor Q5 can be connected to the common node between the first resistor R1 and the first transistor Q1, a gate of the fifth transistor Q5 can be configured to receive the second input signal 'VREF', and a drain of the fifth transistor Q5 can be connected to the drain of the third transistor Q3. Each of the fourth and fifth transistors Q4 and Q5 can be a PMOS transistor.

The second input unit 200 can be configured to amplify a level difference between the first output signal 'OINb' and the second output signal 'OREFb' to output a differentially amplified signal 'DIFF_OUT'. The second input unit 200 can include sixth to twelfth transistors Q6 to Q12.

Sources of the sixth and seventh transistors Q6 and Q7 can be connected to the external power source (VDD). A gate and a drain of the sixth transistor Q6 can be commonly connected to a gate of the seventh transistor Q7. The sixth and seventh transistors Q6 and Q7 can constitute a current mirror.

A source of the eighth transistor Q8 can be connected to the external power source (VDD), a gate of the eighth transistor Q8 can receive the enable signal 'EN', and a drain of the eighth transistor Q8 can be connected to the drain of the sixth transistor Q6.

A source of the ninth transistor Q9 can be connected to the external power source (VDD), a gate of the ninth transistor Q9 can receive the enable signal 'EN', and a drain of the ninth transistor Q9 can be connected to the drain of the seventh transistor Q7. The eighth and ninth transistors Q8 and Q9 can constitute a precharge circuit configured to precharge the differentially amplified signal 'DIFF_OUT' to a high level when the enable signal 'EN' is inactive, e.g., at a low level.

A drain of the tenth transistor Q10 can be connected to the drain of the sixth transistor Q6 and a gate of the tenth transistor Q10 can receive the second output signal 'OREFb'.

A drain of the eleventh transistor Q11 can be connected to the drain of the seventh transistor Q7 and a gate of the eleventh transistor Q11 can receive the first output signal 'OINb'.

A drain of the twelfth transistor Q12 can be commonly connected to sources of the tenth and eleventh transistors Q10 and Q11, a gate of the twelfth transistor Q12 can receive the enable signal 'EN', and a source of the twelfth transistor Q12 can be connected to the ground terminal (VSS). The differentially amplified signal 'DIFF_OUT' can be output through a common node between the seventh and eleventh transistors Q7 and Q11.

A signal 'DIFF_OUTb' which has opposite phase to that of the differentially amplified signal 'DIFF_OUT' can be required in a next stage following the input circuit 101. Thus, depending on the embodiment, an inverter IV1 can be connected to an output terminal of the second input unit 200 in order to invert the differentially amplified signal 'DIFF_OUT' to the signal 'DIFF_OUTb'.

The operation of the input circuit 101 will not be described in detail, starting with the situation where the level of the middle voltage (Vmp) of the first input signal 'IN' and the second input signal 'VREF' is higher than that of the threshold voltage (Vth) of the first and second transistors Q1 and Q2.

In such a situation, the first input signal 'IN' and the second input signal 'VREF' can be separately received through different pads. The first input signal 'IN' can be a clock signal 'CLK', and the second input signal 'VREF' can be an inverted clock 'CLKB', or generally can be a signal with a phase difference relative to the first input signal 'IN'.

When the enable signal 'EN' is deactivated, e.g., at a low level, the third transistor Q3 and the twelfth transistor Q12 are turned off and the eighth transistor Q8 and the ninth transistor Q9 are turned on.

Since the third transistor Q3 and the twelfth transistor Q12 are turned off, the current path of the first input unit 100 and the second input unit 200 is blocked so that the operation of the input circuit is stopped. Since the eighth transistor Q8 and the ninth transistor Q9 are turned on, the differentially amplified signal 'DIFF_OUT' is precharged to a high level.

Meanwhile, when the enable signal 'EN' is activated, e.g., at a high level, the third transistor Q3 and the twelfth transistor Q12 are turned on and the eighth transistor Q8 and the ninth transistor Q9 are turned off. Since the third transistor Q3 and the twelfth transistor Q12 are turned on, a current path through the first input unit 100 and the second input unit 200 is opened.

The first input signal 'IN' can be supplied to the gates of the first and fourth transistors Q1 and Q4 and the second input signal 'VREF' can be supplied to the gates of the second and fifth transistors Q2 and Q5.

A current, which is in proportion to the voltage difference between a gate-source voltage (Vgs) and a threshold voltage (Vth) of each of the first and second transistors Q1 and Q2 of the first amplifier circuit 110 flows through the first and second transistors Q1 and Q2.

Meanwhile, since the level of a gate-source voltage (Vgs) of each of the fourth and fifth transistors Q4 and Q5 of the second amplifier circuit 120 is lower than that of the threshold voltage (Vth) of each of the fourth and fifth transistors Q4 and Q5, the fourth and fifth transistors Q4 and Q5 turn off.

For example, if the voltage level of the first input signal 'IN' is higher than that of the second input signal 'VREF', then the magnitude of the current that flows through the first transistor Q1 is larger than that of the current which flows through the second transistor Q2.

Since the magnitude of the current flowing through the first transistor Q1 is larger than that of the current flowing through the second transistor Q2, the voltage level of the second output signal 'OREFb' is higher than that of the first output signal 'OINb'.

Since the voltage level of the second output signal 'OREFb' is higher than that of the first output signal 'OINb', the magnitude of the current flowing through the tenth transistor Q10 of the second input unit 200 is larger than that of the current flowing through the eleventh transistor Q11. Accordingly, the level of node V2 becomes low according to the increase of the amount of the current that flows through the tenth transistor Q10. Thus, the sixth and seventh transistors Q6 and Q7 are turned on.

Since the sixth and seventh transistors Q6 and Q7 are turned on and the amount of the current flowing through the tenth transistor Q10 is larger than that of the current flowing through the eleventh transistor Q11, the differentially amplified signal 'DIFF_OUT' is output in a high level.

Next, that the situation where the level of the middle voltage (Vmp) of the first input signal 'IN' and the second input signal 'VREF' is lower than that of the threshold voltage (Vth) of the first and second transistors Q1 and Q2, which receive the first input signal 'IN' and the second input signal 'VREF', will be described.

First, when the enable signal 'EN' is inactive, e.g., at a low level, the third transistor Q3 and the twelfth transistor Q12 are turned off and the eighth transistor Q8 and the ninth transistor Q9 are turned on.

Since the third transistor Q3 and the twelfth transistor Q12 are turned off, the current path through the first input unit 100 and the second input unit 200 is blocked so that the operation of the input circuit 101 is stopped. Since the eighth transistor Q8 and the ninth transistor Q9 are turned on, the differentially amplified signal 'DIFF_OUT' is precharged to a high level.

Meanwhile, when the enable signal 'EN' is activated, e.g., at a high level, the third transistor Q3 and the twelfth transistor Q12 are turned on and the eighth transistor Q8 and the ninth transistor Q9 are turned off. Since the third transistor Q3 and the twelfth transistor Q12 are turned on, the current path through the first input unit 100 and the second input unit 200 is opened.

The first input signal 'IN' can be supplied to the gates of the first and fourth transistors Q1 and Q4, and the second input signal 'VREF' can be supplied to the gates of the second and fifth transistors Q2 and Q5.

Since the level of the gate-source voltage (Vgs) of each of the first and second transistors Q1 and Q2 of the first amplifier circuit 110 is lower than that of each threshold voltage (Vth) of the first and second transistors Q1 and Q2, the first and second transistors Q1 and Q2, which are NMOS transistors in this example, cannot operate.

Meanwhile, since the level of the gate-source voltage (Vgs) of each of the fourth and fifth transistors Q4 and Q5 of the second amplifier circuit 120 is higher than that of each threshold voltage (Vth) of the fourth and fifth transistors Q4 and Q5, the fourth and fifth transistors Q4 and Q5, which are PMOS transistors in this example, can operate.

For example, if the voltage level of the second input signal 'VREF' is lower than that of the first input signal 'IN', then the magnitude of the current flowing through the fifth transistor Q5 of the second amplifier circuit 120 is larger than that of the current flowing through the fourth transistor Q4.

when the level of the middle voltage (Vmp) of the first input signal 'IN' and the second input signal 'VREF' is higher than that of the threshold voltage (Vth) of the first and second transistors Q1 and Q2, the first and second transistors Q1 and Q2, which are NMOS transistors, should operate.

However, since the level of the middle voltage (Vmp) of the first input signal 'IN' and the second input signal 'VREF' is lower than that of the threshold voltage (Vth) of the first and second transistors Q1 and Q2, the level of the gate-source voltage (Vgs) of each of the first and second transistors Q1 and Q2 cannot be higher than that of the threshold voltage (Vth) of each of the first and second transistors Q1 and Q2, but the level of the gate-source voltage (Vgs) of each of the fourth and fifth transistors Q4 and Q5 can be higher than that of the threshold voltage (Vth) of each of the fourth and fifth transistors Q4 and Q5.

Therefore, the fifth transistor Q5 operates in place of the first transistor Q1 and the fourth transistor Q4 operates in place of the second transistor Q2.

Since the amount of the current flowing through the fifth transistor Q5 is larger than that of the current flowing through the fourth transistor Q4, the voltage level of the second output signal 'OREFb' is higher than that of the first output signal 'OINb'.

Since the voltage level of the second output signal 'OREFb' is higher than that of the first output signal 'OINb', the amount of the current flowing through the tenth transistor Q10 of the second input unit 200 is larger than that of the current flowing through the eleventh transistor Q11. The level of node V2 becomes low according to the increase of the amount of the current that flows through the tenth transistor Q10. Thus, the sixth and seventh transistors Q6 and Q7 are turned on.

Since the sixth and seventh transistors Q6 and Q7 are turned on and the amount of the current flowing through the tenth transistor Q10 is larger than that of the current flowing through the eleventh transistor Q11, the differentially amplified signal 'DIFF_OUT' is outputted in a high level.

Accordingly, if the level of the middle voltage (Vmp) of the first input signal 'IN' and the second input signal 'VREF' is higher than that of the threshold voltage (Vth) of the first and second transistors Q1 and Q2, the first and second transistors Q1 and Q2 of the differential amplifier operate so that the input circuit can operate.

But even if the level of the middle voltage (Vmp) of the first input signal 'IN' and the second input signal 'VREF' is lower than that of the threshold voltage (Vth) of the first and second transistors Q1 and Q2 and thus the first and second transistors Q1 and Q2 of the differential amplifier cannot operate, the fourth and fifth transistors Q4 and Q5 can substitute for the first and second transistors Q1 and Q2 so that the input circuit 101 can operate normally.

In other words, the first input unit 100 can operate normally regardless of a voltage fluctuation. Also, the second input unit 200 is suitable for a high speed operation so that the operating speed of the input circuit 101 can be increased. Besides the second input unit 200 shown in FIG. 3, it is possible to use any type of amplifier circuit for the second input unit.

Since the differential amplifier and therefore the input circuit 101 using the differential amplifier operate normally even if a change of an external voltage occurs, an accurate and stable processing of an input signal is possible. Also, a high speed operation is possible.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A differential amplifier comprising:
a plurality of first switching transistors configured to output differentially amplified signals through output terminals when a voltage level of a first input signal and a second input signal belongs to a first range; and
a plurality of second switching transistors coupled with the plurality of first switching transistors, the plurality of second switching transistors configured to output the differentially amplified signals through the output terminals when the voltage level of the first input signal and the second input signal belongs to a second range,
wherein sources of the first switching transistors and drains of the second switching transistors are connected in common.

2. The differential amplifier of claim 1, wherein the plurality of the first switching transistors are connected in parallel to each other between a power source terminal and a ground terminal, and are configured to receive the first input signal and the second input signal respectively and output the differentially amplified signals when the voltage level of the first input signal and the second input signal belongs to the first range.

3. The differential amplifier of claim 2, wherein the plurality of the first switching transistors include:
a first transistor including a gate receiving the first input signal, a drain connected with the power source terminal, and a source connected with the ground terminal; and
a second transistor including a gate receiving the second input signal, a drain connected with the power source terminal, and a source connected with the ground terminal, connected in parallel to the first transistor.

4. The differential amplifier of claim 3, wherein the first and second transistors are NMOS transistors.

5. The differential amplifier of claim 1, wherein the plurality of the second switching transistors are connected in parallel to the plurality of the first switching transistors between a power source terminal and a ground terminal, and are configured to receive the first input signal and the second input signal and output the differentially amplified signals when the voltage level of the first input signal and the second input signal belongs to the second range.

6. The differential amplifier of claim 3, wherein the plurality of the second switching transistors include:
a third transistor including a gate receiving the second input signal, a source connected with the drain of the first transistor, and a drain connected with the source of the first transistor; and
a fourth transistor including a gate receiving the first input signal, a source connected with the drain of the second transistor, and a drain connected with the source of the third transistor.

7. The differential amplifier of claim 6, wherein the third and the fourth transistors are PMOS transistors.

8. The differential amplifier of claim 1, wherein the output terminals are connected to the plurality of the first switching transistors which receive the first input signal, and to one of the plurality of the second switching transistors which receive the second input signal.

9. The differential amplifier of claim 1, wherein the first input signal has opposite phase to that of the second input signal.

10. The differential amplifier of claim 9, wherein the first and second input signals include a clock signal.

11. The differential amplifier of claim 1, wherein a middle voltage level of the first range is higher than that of the second range.

12. An input circuit comprising:
a first input unit configured to differentially amplify a voltage level difference between a first input signal and a second input signal to output first differentially amplified signals by using a plurality of switching elements configured to selectively operate when a voltage level of the first input signal and the second input signal is within a first range or when a voltage level of the first input signal and the second input signal is within a second range; and
a second input unit configured to differentially amplify the first differentially amplified signals to output second differentially amplified signals,
wherein the second input unit includes:
a current mirror connected to a power source terminal; and
a plurality of switching elements connected between the current mirror and a ground terminal and configured to operate in response to the first differentially amplified signals.

13. The input circuit of claim 12, wherein the first input unit includes:
a first amplifier circuit configured to output the first differentially amplified signals when a voltage level of the first input signal and the second input signal is within the first range; and
a second amplifier circuit configured to output the first differentially amplified signals when the voltage level of the first input signal and the second input signal is within the second range.

14. The input circuit of claim 13, wherein the first amplifier circuit includes:
a first transistor connected between a power source terminal and a ground terminal and operates in response to the first input signal; and
a second transistor connected in parallel to the first transistor between the power source terminal and the ground terminal and operates in response to the second input signal.

15. The input circuit of claim 14, wherein the first and second transistors are NMOS transistors.

16. The input circuit of claim 14, wherein the second amplifier circuit includes:
a third transistor connected in parallel to the first transistor and configured to operate in response to the second input signal; and
a fourth transistor connected in parallel to the second transistor and configured to operate in response to the first input signal.

17. The input circuit of claim 16, wherein the third and the fourth transistors are PMOS transistors.

18. The input circuit of claim 13, wherein the first input signal has opposite phase to that of the second input signal.

19. The input circuit of claim 18, wherein the first and second input signals include a clock signal.

20. The input circuit of claim 13, wherein a middle voltage level of the first range is higher than that of the second range.

21. The input circuit of claim 13, wherein the first input unit further includes a switching element connected between the first amplifier circuit and a ground terminal and configured to open a current path of the first input unit in response to an enable signal.

22. The input circuit of claim 12, wherein the second input unit further includes a switching element connected between the plurality of the switching elements and the ground terminal and configured to open a current path of the second input unit in response to an enable signal.

23. The input circuit of claim 22, wherein the second input unit further includes a precharge circuit configured to precharge an output terminal of the second input unit in response to the enable signal.

24. The input circuit of claim 23, wherein the precharge circuit includes the plurality of the switching elements connected to the current mirror.

* * * * *